(12) United States Patent
Dusad et al.

(10) Patent No.: US 8,742,845 B2
(45) Date of Patent: Jun. 3, 2014

(54) AMPLIFIER CIRCUITS WITH REDUCED POWER CONSUMPTION

(75) Inventors: Shagun Dusad, Bangalore (IN); Lokesh Kumar Gupta, Bangalore (IN); Visvesvaraya Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 13/476,330

(22) Filed: May 21, 2012

(65) Prior Publication Data

US 2013/0307623 A1 Nov. 21, 2013

(51) Int. Cl.
*H03F 3/45* (2006.01)
(52) U.S. Cl.
CPC ....................................... *H03F 3/45* (2013.01)
USPC ........................................... 330/253; 330/252
(58) Field of Classification Search
CPC ........................................................ H03F 3/45
USPC .................................................. 330/252, 253
See application file for complete search history.

(56) References Cited

U.S. PATENT DOCUMENTS 7,233,202 B2 * 6/2007 Tu .................................. 330/253
7,573,331 B2 * 8/2009 Nainar .......................... 330/253

* cited by examiner

*Primary Examiner* — Robert Pascal
*Assistant Examiner* — Khiem Nguyen
(74) *Attorney, Agent, or Firm* — Steven A. Shaw; Wade James Brady, III; Frederick J. Telecky, Jr.

(57) ABSTRACT

Various embodiments of an amplifier circuit are provided. In one embodiment, the amplifier circuit includes an input differential circuitry configured to convert a pair of input differential voltage signals to a pair of differential current signals. The amplifier circuit includes a cascode circuitry operable to mirror the pair of differential current signals received from the first output terminal and the second output terminal to an output terminal of the first cascode transistor and an output terminal of the second cascode transistor. The amplifier circuit includes a current control circuit operable to divert an amount of bias current to reduce a current through the cascode circuitry, to thereby reduce a load of the amplifier circuit, the reduction in the load of the amplifier circuit allowing a reduction in current through the input differential circuitry for maintaining a predetermined bandwidth of the amplifier circuit.

8 Claims, 3 Drawing Sheets

US 8,742,845 B2

AMPLIFIER CIRCUITS WITH REDUCED POWER CONSUMPTION

TECHNICAL FIELD

The present disclosure generally relates to amplifier circuits.

BACKGROUND

In an exemplary scenario, differential transconductance amplifiers may be implemented in an electronic circuit. Exemplary differential transconductance amplifiers may include, for example, amplifiers configured to produce a differential current proportionate to a differential input voltage. Transconductance amplifiers may include, for example, a differential amplifier circuitry at an input stage so as to generate a differential current proportional to the differential input voltage. The transconductance amplifiers can be implemented in a telescopic topology, and such telescopic transconductance amplifiers may include, for example, a folded cascode design with a pair of transistors forming the differential amplifier at the input and a pair of separate current branches for drawing a differential output. In telescopic transconductance amplifiers, a pair of input currents may be injected through the differential amplifier, and the injected pair of currents may be mirrored with a cascode configuration so as to produce a pair of output currents. The telescopic topology puts both the differential amplifier and the output on a pair of common current branches so as to eliminate noise issues and also allow high speed operation.

SUMMARY

A number of exemplary amplifier circuits are disclosed herein. In an embodiment, an amplifier circuit with reduced power consumption is disclosed. The amplifier circuit includes an input differential circuitry configured to provide a pair of differential current signals at a first output terminal and a second output terminal in response to a pair of input differential voltage signals. The amplifier circuit includes a cascode circuitry comprising a first cascode transistor having a terminal coupled with the first output terminal of the input differential circuitry and a second cascode transistor having a terminal coupled with the second output terminal of the input differential circuitry, the cascode circuitry being configured to mirror the pair of differential current signals at an output terminal of the first cascode transistor and an output terminal of the second cascode transistor. The amplifier circuit also includes a current control circuit configured to divert an amount of bias current so as to reduce a current through the cascode circuitry to thereby reduce a load of the amplifier circuit. The reduction in the load of the amplifier circuit allows reduction in current through the input differential circuitry for maintaining a predetermined bandwidth of the amplifier circuit.

Additionally, in an embodiment, a telescopic amplifier circuit includes an input differential circuitry configured to convert a pair of input differential voltage signals to a pair of differential current signals. The input differential circuitry includes a first input transistor and a second input transistor including a first output terminal and a second output terminal respectively. The pair of input differential voltage signals are converted into the pair of differential current signals at the first output terminal and the second output terminal. Furthermore, the telescopic amplifier circuit includes a cascode circuitry including a first cascode transistor coupled with the first output terminal of the input differential circuitry and a second cascode transistor coupled with the second output terminal of the input differential circuitry. The cascode circuitry is configured to mirror the pair of differential current signals at an output terminal of the first cascode transistor and an output terminal of the second cascode transistor. The telescopic amplifier circuit also includes a current control circuit including a first current source and a second current source. The first current source is coupled with the first output terminal of the input differential circuitry and the second current source is coupled with the second output terminal of the input differential circuitry. The current control circuit is configured to divert an amount of bias current so as to reduce current through the cascode circuitry to thereby reduce a load of the telescopic amplifier circuit. The reduction in the load of the telescopic amplifier circuit allows reduction in of current through the input differential circuitry for maintaining a predetermined bandwidth of the telescopic amplifier circuit. The input differential circuitry, the cascode circuitry and the current control circuit are connected in a telescopic topology.

Moreover, in an embodiment, a transconductance amplifier circuit is disclosed. The transconductance amplifier circuit includes an input differential circuitry configured to convert a pair of input differential voltage signals to a pair of differential current signals. The input differential circuitry includes a first input transistor and a second input transistor. The first input transistor and a second input transistor include a first output terminal and a second output terminal respectively. The pair of input differential voltage signals are converted into the pair of differential current signals at the first output terminal and the second output terminal. The transconductance amplifier circuit additionally includes a cascode circuitry including a first cascode transistor coupled with the first output terminal of the input differential circuitry and a second cascode transistor coupled with the second output terminal of the input differential circuitry. The cascode circuitry is configured to mirror the pair of differential current signals at an output terminal of the first cascode transistor and an output terminal of the second cascode transistor. Moreover, the transconductance amplifier circuit includes a current control circuit including a first transistor, a second transistor and a current source for biasing the first transistor and the second transistor. The first transistor is configured to receive a first input of the pair of input differential voltage signals and is coupled with the first output terminal, and the second transistor is configured to receive a second input of the pair of input differential voltage signals and is coupled with the second output terminal. The current source is coupled between a common terminal of the first transistor and the second transistor and a power supply terminal. The current control circuit is configured to divert an amount of bias current so as to reduce current through the cascode circuitry to thereby reduce a load of the transconductance amplifier circuit. The reduction in the load of the transconductance amplifier circuit allows reduction in of current through the input differential circuitry for maintaining a predetermined bandwidth of the transconductance amplifier circuit.

DETAILED DESCRIPTION

Pursuant to an exemplary scenario, a differential transconductance amplifier is an amplifier that produces an output current based on a differential input voltage. For an exemplary differential transconductance amplifier, the output current is a linear function of the differential input voltage given by the below equation:

$$I_{out}=(V_{in+}-V_{in-})*g_m$$

where, $V_{in+}$ represents a voltage at a non-inverting input, $V_{in-}$ represents a voltage at an inverting input, and $g_m$ is the transconductance of the amplifier. It is noted that the terminology "transconductance" may be construed as referring to an expression of the performance of an amplifier and is a sensitivity of the output current $I_{out}$ to a change in input voltage (e.g., $V_{in+}-V_{in-}$). Larger the transconductance figure for the amplifier greater gain and/or amplification the amplifier is capable of delivering. The transconductance of the transconductance amplifier may be controlled by a bias current of the transconductance amplifier. In certain configurations, a differential transconductance amplifier may be implemented in a telescopic topology to form a telescopic amplifier. The telescopic amplifier may include, for example, a plurality of transistors placed one on top of the other such that the transistors are electronically connected in series between a power supply terminal and a ground terminal.

Figure 1:
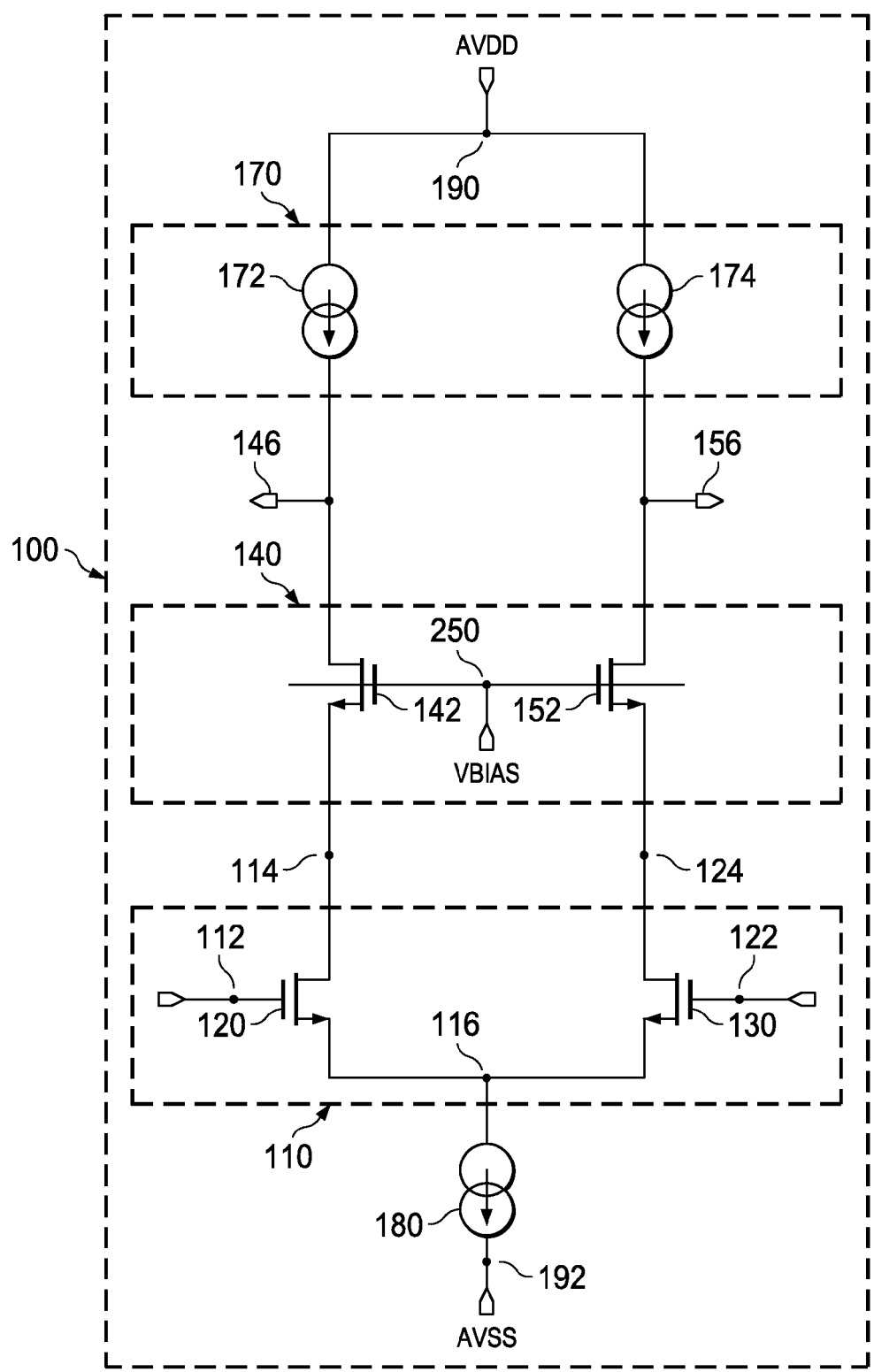
FIG. 1 is a telescopic amplifier circuit according to an exemplary scenario.

FIG. 1 is a telescopic amplifier circuit 100 according to an exemplary scenario. The telescopic amplifier circuit 100 includes an input differential circuitry 110, a cascode circuitry 140, a pair of current sources 170, and a tail current source 180, coupled or serially connected between a power supply terminal AVDD 190 and a ground terminal AVSS 192. The input differential circuitry 110 includes a plurality of input transistors, such as, for example, a first input transistor 120 and a second input transistor 130. The input differential circuitry 110 is configured to generate a pair of differential current signals at terminals 114 and 124, respectively, based on a differential input voltage applied across an input terminal 112 and an input terminal 122 of the input transistors 120 and 130, respectively. The cascode circuitry 140 is coupled with the input differential circuitry 110 so as to mirror the pair of differential current signals received from terminals 114 and 124 at an output (see, e.g., 146 and 156) of the cascode circuitry 140. The cascode circuitry copies the pair of differential current signals received from the terminals 114 and 124 to the output.

The cascode circuitry 140 includes a plurality of transistors, such as, for example, a first transistor 142 and a second transistor 152. The input differential circuitry 110 is coupled with or connected to the cascode circuitry 140 so as to substantially form a pair of differential cascode configurations, such as illustrated in FIG. 1. As shown in FIG. 1, the first transistor 142 is coupled between the terminal 114 of the first input transistor 120 and the output 146 of the telescopic amplifier circuit 100, and the second transistor 152 is coupled between the terminal 124 and the output 156 of the telescopic amplifier circuit 100. Input terminals (e.g., gate terminal 250) of the first transistor 142 and the second transistor 152 are coupled with or connected to a common biasing voltage (see, e.g., Vbias).

The pair of current sources 170 includes a current source 172 and a current source 174 coupled between the power supply terminal AVDD 190 and the transistors 142 and 152, respectively. The current sources 172 and 174 provide currents and function as loads to the telescopic amplifier circuit 100. The telescopic amplifier circuit 100 of the exemplary scenario additionally includes the tail current source 180 for sinking a constant reference current. The tail current source 180 is coupled between a common terminal 116 of first input transistor 120 and the second input transistor 130 and the ground terminal AVSS 192.

In accordance with an exemplary implementation, a closed-loop bandwidth ($W_{clb}$) of the telescopic amplifier circuit 100 is calculated as follows:

$$W_{clb}=g_m/(F*C_{out}),$$

where $g_m$ represents a transconductance of the telescopic amplifier circuit 100 (e.g., an input transistor transconductance associated with the telescopic amplifier circuit 100), F is an inverse of feedback factor of the amplifier circuit 100, and $C_{out}$ is a total output capacitance of the telescopic amplifier circuit 100. It is noted that the terminology "feedback factor" may be construed as referring to an amount of output of the telescopic amplifier circuit 100 fed back as an input of the amplifier circuit 100 when the telescopic amplifier circuit 100 operates in a closed loop configuration. It is noted that $C_{out}$ may include a load capacitance, self parasitic capacitances contributed by a plurality of transistors (e.g., transistors 142 and 152) associated with the cascode circuitry 140, and self parasitic capacitances of the current sources 172 and 174 of the telescopic amplifier circuit 100 when the current sources 172 and 174 are implemented using transistors. For a high value of transconductance, the self parasitic capacitances of these transistors constitute a significant portion of $C_{out}$.

Various embodiments of the present technology may be implemented to reduce the amount of current flowing through a cascode circuitry in a telescopic amplifier circuit, such as the cascode circuitry 140 in the telescopic amplifier circuit 100. For reduced passage of current through the cascode circuitry 140, the size of the transistors (e.g., the transistors 142 and 152) of the cascode circuitry 140 may be reduced. Also, with the reduction in size of the transistors of the cascode circuitry 140, the self parasitic capacitances contributed by the cascode transistors are also reduced. Further, when the current sources 172 and 174 are implemented using transistors, as the current through the current sources 172 and 174 is reduced, the self parasitic capacitances contributed by the current sources 172 and 174 also reduces. The reduction in the self parasitic capacitances contributed by the cascode transistors and the current sources 172 and 174 thereby leads to a reduction in the total output capacitance $C_{out}$. The reduction in $C_{out}$ leads to an increase in the bandwidth of the telescopic amplifier circuit 100. In order to maintain the bandwidth of the telescopic amplifier circuit 100 constant, the transconductance of the input transistors needs to be decreased proportional to the decrease in $C_{out}$.

One or more embodiments of the present technology may be implemented to maintain the bandwidth of the amplifier circuit constant at a predetermined value while reducing the transconductance associated with the input transistors by reducing the current through the input transistors. In an embodiment, an amount of the bias current from the input transistors is diverted from flowing through the cascode circuitry to reduce a current through the cascode circuitry. The reduction in the current through the cascode circuitry leads to a reduction in a load of the amplifier circuit. With the reduction in the load of the amplifier circuit, the current through the input transistors may be reduced thereby reducing the transconductance of the input transistors to maintain the bandwidth constant. For a predetermined bandwidth of the amplifier circuit, the amount of bias current to be diverted from flowing through the cascode circuitry is determined based on a maximum slew current of the amplifier circuit and/or a predetermined location of a cascode pole of the amplifier circuit. It is noted that the terminology "maximum slew current" may be construed as referring to a maximum amount of current required to achieve a predetermined slew rate for optimal performance of the amplifier circuit. The reduction in the current through the input transistors reduces the power consumed by the amplifier circuit for the predetermined bandwidth.

Moreover, in various embodiments of the present technology, power consumption in an amplifier circuit is minimized while a bandwidth of the amplifier circuit is maintained. In an embodiment, the amplifier circuit is implemented based on the telescopic topology so as to form a telescopic amplifier. In an embodiment, the amplifier circuit disclosed herein includes a current control circuit configured to divert an amount of bias current from the input differential circuitry to thereby reduce a passage of current through the cascode circuitry and in turn reduce a passage of current through the input differential circuitry to reduce a power consumption of the amplifier circuit for the predetermined bandwidth.

Figure 2:
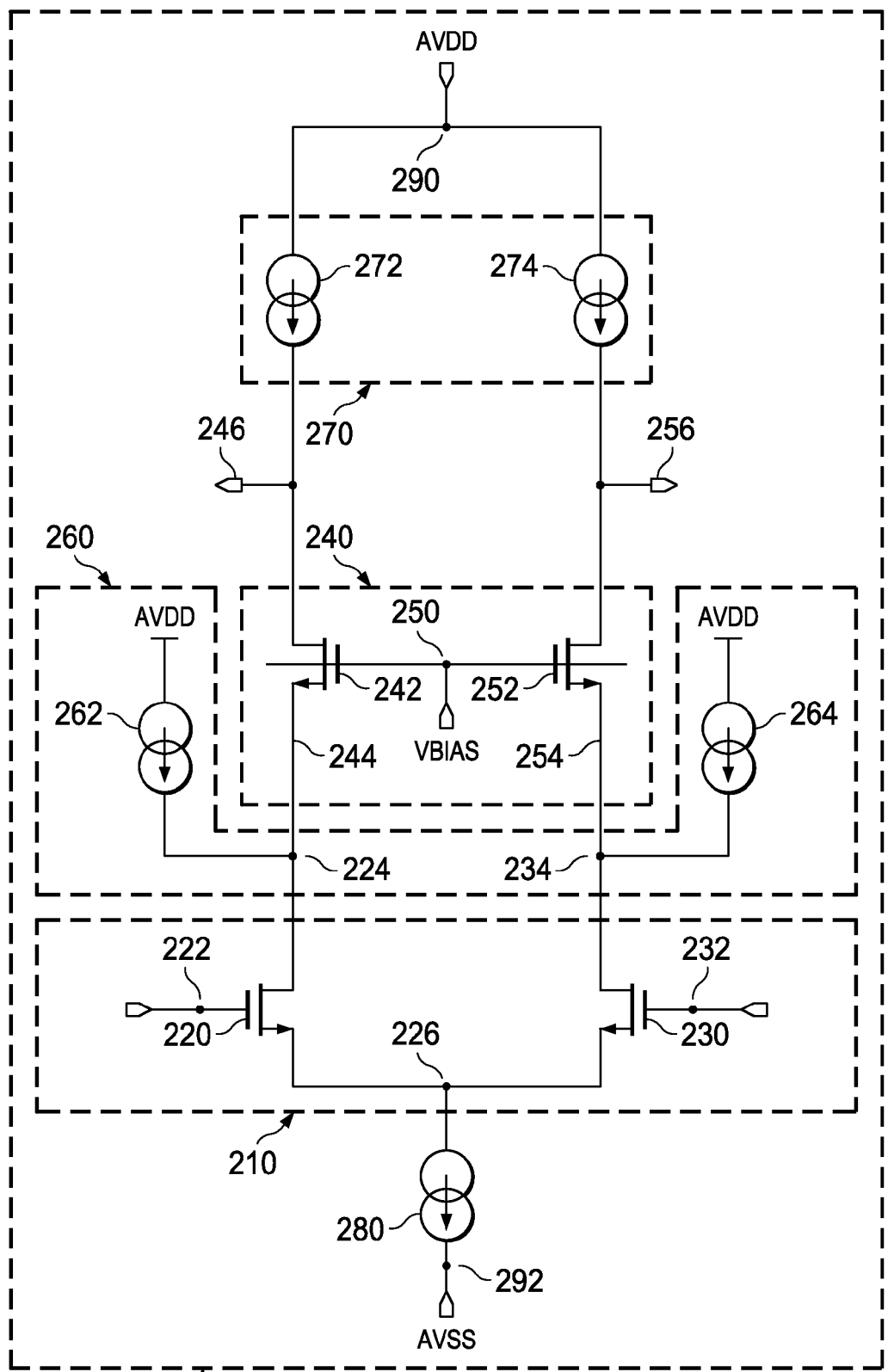
FIG. 2 is a telescopic amplifier circuit with a current control circuit according to an embodiment.

Referring now to FIG. 2, a circuit diagram of a telescopic amplifier circuit 200 with a current control circuit 260 configured to reduce power consumption is shown, according to an embodiment of the present technology. The telescopic amplifier circuit 200 includes an input differential circuitry 210, a cascode circuitry 240 and a current control circuit 260. The input differential circuitry 210 may be similar to the input differential circuitry 110 of FIG. 1, and the cascode circuitry 240 may be similar to the cascode circuitry 140 of FIG. 1. The input differential circuitry 210 is configured to convert a pair of input differential voltage signals into a pair of differential current signals. In an embodiment, the input differential circuitry includes a pair of input transistors, such as, for example, a first input transistor 220 and a second input transistor 230. With reference to the embodiment illustrated in FIG. 2, it is noted that although the first input transistor 220 and the second input transistor 230 are shown as a complementary metal-oxide-semiconductor transistor (e.g., an NMOS transistor or a PMOS transistor), these transistors can also be other field effect transistors, bipolar junction transistors (e.g., an NPN type transistor or a PNP type transistor), and the like.

The pair of input differential voltage signals may be applied across the first input transistor 220 and the second input transistor 230; for example, the voltage signals Vin1 and Vin2 may be applied to gate terminals 222 and 232 of the first input transistor 220 and the second input transistor 230, respectively. The first input transistor 220 and the second input transistor 230 generate the pair of differential current signals at a pair of output terminals of the input differential circuitry 210. For example, a pair of differential current signals may be generated across a first output terminal 224 and a second output terminal 234 of the input differential circuitry 210. As shown in FIG. 2, the first output terminal 224 may be a drain terminal of the first input transistor 220 and the second output terminal 234 may be a drain terminal of the second input transistor 230, the first input transistor 220 and the second input transistor 230 being NMOS transistors.

In an embodiment, the cascode circuitry 240 includes a plurality of cascode transistors, such as, for example, a first cascode transistor 242 and a second cascode transistor 252. In one embodiment, a terminal 244 (e.g., a source terminal) of the first cascode transistor 242 is coupled with or connected to the first output terminal 224 of the input differential circuitry 210, and a terminal 254 (e.g., a source terminal) of the second cascode transistor 252 is coupled with or connected to the second output terminal 234 of the input differential circuitry 210. The cascode circuitry 240 is configured to mirror the pair of current signals received from the first and second output terminals 224 and 234 at an output terminal 246 of the first cascode transistor 242 and an output terminal 256 of the second cascode transistor 252 respectively. Although, in this embodiment, the first cascode transistor 242 and the second cascode transistor 252 are shown as complementary metal-oxide-semiconductor transistors (e.g., NMOS transistors or PMOS transistors), these transistors can also be other field effect transistor, bipolar junction transistors (e.g., an NPN type transistor, a PNP type transistor), and the like.

In an embodiment, the first input transistor 220, the second input transistor 230, the first cascode transistor 242, and the second cascode transistor 252 are n-type metal oxide semiconductor based transistors or NPN type transistors. In another embodiment, the first input transistor 220, the second input transistor 230, the first cascode transistor 242, and the second cascode transistor 252 are p-type metal oxide semiconductor based transistors or PNP type transistors. In yet another embodiment, the first input transistor 220, the second input transistor 230 are NPN type transistors and the first cascode transistor 242, and the second cascode transistor 252 are n-type metal oxide semiconductor based transistors. In yet another embodiment, the first input transistor 220, the second input transistor 230 are PNP type transistors and the first cascode transistor 242, and the second cascode transistor 252 are p-type metal oxide semiconductor based transistors. In yet another embodiment, the first input transistor 220, the second input transistor 230 are n-type metal oxide semiconductor based transistors and the first cascode transistor 242, and the second cascode transistor 252 are NPN type transistors. In yet another embodiment, the first input transistor 220, the second input transistor 230 are p-type metal oxide semiconductor based transistors and the first cascode transistor 242, and the second cascode transistor 252 are PNP type transistors.

In an embodiment, the current control circuit 260 includes a first current source 262 and a second current source 264. In this embodiment, the first current source 262 is coupled with the first output terminal 224 and the second current source 264 is coupled with the second output terminal 234 of the input differential circuitry 210. In an embodiment, the first current source 262 is coupled between a power supply (see, e.g., AVDD shown in FIG. 2) and the drain terminal (e.g., the first output terminal 224) of the first input transistor 220 and source terminal 244 of the first cascode transistor 242. Similarly, an embodiment provides that the second current source 264 is coupled between a power supply (e.g., AVDD) and a drain terminal (e.g., the terminal 234) of the second input transistor 230 and the source terminal 254 of the second cascode transistor 252.

In accordance with an embodiment, the current control circuit 260 is configured to divert an amount of bias current from the input differential circuitry 210 to thereby reduce a passage of current through the cascode circuitry 240. Such a reduction in the current flowing through the cascode circuitry 240 causes a reduction in the power consumption of the amplifier circuit 200. In certain embodiments, an amount of bias current that is diverted is determined based on a maximum slew current of the telescopic amplifier circuit 200. In certain embodiments, the amount of bias current that can be diverted also depends upon the location of a cascode pole of the telescopic amplifier circuit 200.

In an embodiment, the telescopic amplifier circuit 200 additionally includes a pair of current sources 270 coupled between a power supply terminal AVDD 290 and the output terminals (246 and 256) of the cascode circuitry 240. Indeed, and with reference still to FIG. 2, an exemplary embodiment provides that the pair of current sources 270 includes a current source 272 and a current source 274. The current source 272 is coupled between the power supply terminal AVDD 290 and the output terminal 246 of the first cascode transistor 242, and the current source 274 is coupled between the power supply terminal AVDD 290 and the output terminal 256 of the second cascode transistor 252. The current sources 272 and 274 provide currents to, and function as a load for the telescopic amplifier circuit 200. In an embodiment, the telescopic amplifier circuit 200 additionally includes a current source 280 coupled with or connected to a common terminal 226 (e.g., a source terminal) of the first input transistor 220 and the second input transistor 230 and a ground terminal AVSS 292. The current source 280 may be configured to function as a tail current source, and the tail current source may be configured to sink a constant reference current. In an embodiment, the current sources 272, 274 and 280 are ideal current sources.

In an exemplary case, if a current of I amperes is injected into the telescopic amplifier circuit 200 through the current source 280, and if I/2 amperes is the current sufficient to achieve a predetermined slew rate for the telescopic amplifier circuit 200, the current control circuit 260 is configured to divert I/2 amperes of current from the first output terminal 224 and the second output terminal 234 into the current control circuit 260, thereby allowing the remainder of I/2 amperes of current to pass into the cascode circuitry 240. The passage of I/2 amperes of current through the cascode circuitry 240, rather than I amperes, reduces the load on the telescopic amplifier circuit 200 allowing a reduction in passage of current through the input differential circuitry 210 and consequently leads to a reduction in the power consumption of the telescopic amplifier circuit 200. In an embodiment, the diverted current is drawn from a lower power supply that further reduces the power consumed by the telescopic amplifier circuit 200.

In certain embodiments of the present technology, the current control circuit of the amplifier circuit may be in a differential configuration and may operate to function substantially similar to a differential circuit. Examples of differential circuits that may be implemented may include, but are not limited to, an NMOS differential circuit, a PMOS differential circuit, an NPN differential circuit, a PNP differential circuit, and the like. Moreover, an embodiment provides that the current control circuit includes a plurality of transistors and a current source configured to bias the plurality of transistors.

Figure 3:
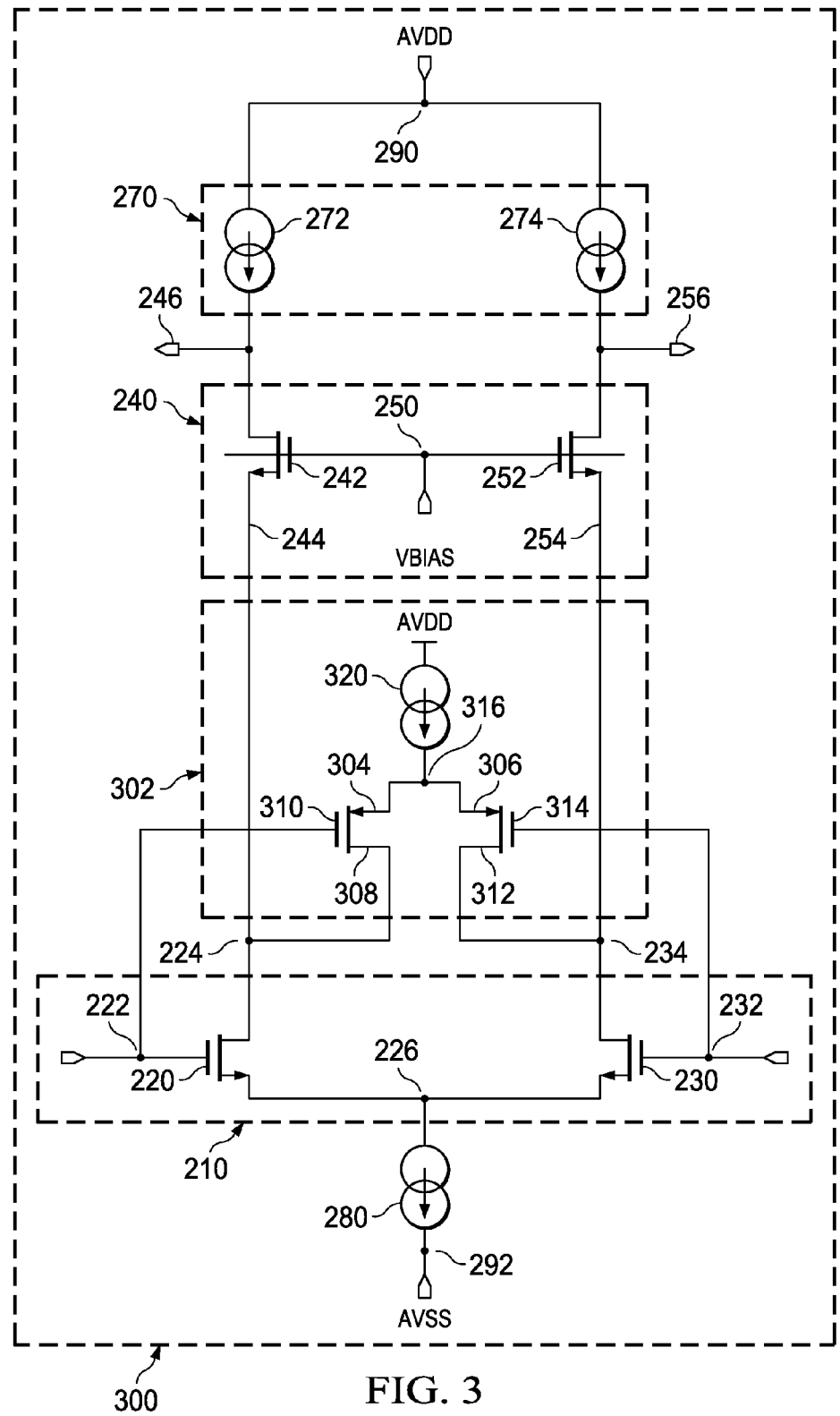
FIG. 3 is a transconductance amplifier circuit with a current control circuit in a differential configuration according to an embodiment.

FIG. 3 is a transconductance amplifier circuit 300 with a current control circuit 302 in a differential configuration so as to reduce power consumption according to another embodiment. The transconductance amplifier circuit 300 is similar to the telescopic amplifier circuit 200, except that a current control circuit 302 is utilized in place of the current control circuit 260. In an embodiment, the amplifier circuit 300 includes an input differential circuitry, such as the input differential circuitry 210, the current control circuit 302 and a cascode circuitry, such as the cascode circuitry 240, coupled with one another or connected in a telescopic topology. In one embodiment, the amplifier circuit 300 also includes the pair of current sources 270 and current source 280. In an embodiment, the pair of current sources 270, the cascode circuitry 240, the current control circuit 302, the input differential circuitry 210, and the current source 280 are coupled or connected in a serial fashion between the power supply terminal AVDD 290 and the ground terminal AVSS 292.

In an embodiment, the current control circuit 302 includes a first transistor 304 and a second transistor 306, and a current source 320 for biasing the transistors 304 and 306. The current control circuit 302 is coupled with or connected to the input differential circuitry 210 and the cascode circuitry 240. In one embodiment, the first input transistor 220, the second input transistor 230, the first cascode transistor 242, and the second cascode transistor 252 are n-type metal oxide semiconductor based transistors, and the first transistor 304 and the second transistor 306 are p-type metal oxide semiconductor based transistors. A first terminal (e.g., a drain terminal 308) of the first transistor 304 is coupled with or connected to the first output terminal (e.g., a drain terminal 224) of the first input transistor 220 and the source terminal 244 of the cascode transistor 242. A second terminal (e.g., a gate terminal 310) of the first transistor 304 is coupled with or connected to the first input of the differential voltage signal (see, e.g., the gate terminal 222 of the first input transistor 220). Similarly, a first terminal (e.g., a drain terminal 312) of the second transistor 306 is coupled with or connected to the second output terminal (e.g., a drain terminal 234) of the second input transistor 230 and the source terminal 254 of the cascode transistor 252.

A second terminal (e.g., a gate terminal 314) of the second transistor 306 is coupled with or connected to the second input of the differential voltage signal (see, e.g., the gate terminal 232 of the second input transistor 230). Third terminals (e.g., source terminals of the transistors 304 and 306) of both of the transistors 304 and 306 are coupled with or connected to a common terminal 316 that is coupled with or connected to a current source 320. In an embodiment, the first input transistor 220, the second input transistor 230, the first cascode transistor 242, and the second cascode transistor 252 are p-type metal oxide semiconductor based transistors, and the first transistor 304 and the second transistor 306 are n-type metal oxide semiconductor based transistors or NPN type transistors. In an embodiment, the first input transistor 220, the second input transistor 230, the first cascode transistor 242, and the second cascode transistor 252 are n-type metal oxide semiconductor based transistors, and the first transistor 304 and the second transistor 306 are p-type metal oxide semiconductor based transistors or PNP type transistors.

In one embodiment, the first input transistor 220, the second input transistor 230, the first cascode transistor 242, and the second cascode transistor 252 are PNP type transistors, and the first transistor 304 and the second transistor 306 are NPN type transistors or n-type metal oxide semiconductor based transistors. Furthermore, an embodiment provides that the first input transistor 220, the second input transistor 230, the first cascode transistor 242, and the second cascode transistor 252 are NPN type transistors, and the first transistor 304 and the second transistor 306 are PNP type transistors or p-type metal oxide semiconductor based transistors. Furthermore, an embodiment provides that the first input transistor 220, the second input transistor 230 are n-type metal oxide semiconductor based transistors, the first cascode transistor 242, and the second cascode transistor 252 are NPN type transistors, and the first transistor 304 and the second transistor 306 are PNP type transistors or p-type metal oxide semiconductor based transistors. Furthermore, an embodiment provides that the first input transistor 220, the second input transistor 230 are p-type metal oxide semiconductor based transistors, the first cascode transistor 242, and the second cascode transistor 252 are PNP type transistors, and the first transistor 304 and the second transistor 306 are NPN type transistors or n-type metal oxide semiconductor based transistors. Furthermore, an embodiment provides that the first input transistor 220, the second input transistor 230 are NPN type transistors, the first cascode transistor 242, and the second cascode transistor 252 are n-type metal oxide semiconductor based transistors, and the first transistor 304 and the second transistor 306 are PNP type transistors or p-type metal oxide semiconductor based transistors. Furthermore, an embodiment provides that the first input transistor 220, the second input transistor 230 are PNP type transistors, the first cascode transistor 242, and the second cascode transistor 252 are p-type metal oxide semiconductor based transistors, and the first transistor 304 and the second transistor 306 are NPN type transistors or n-type metal oxide semiconductor based transistors.

In an embodiment, the current control circuit 302 is biased through the differential voltage signal applied to the gate terminals 310 and 314 of the transistors 304 and 306, respectively. The current control circuit 302 is configured to divert an amount of bias current from the first output terminal 224 and the second output terminal 234 of the input differential circuitry 210 so as to reduce the passage of current through the cascode circuitry 240. The reduction in the passage of current through the cascode circuitry 240 leads to a corresponding reduction in load of the transconductance amplifier circuit 300. With the reduction in the load of the transconductance amplifier circuit 300, the passage of current through the input transistors may be reduced thereby reducing the transconductance of the input transistors 220 and 230 to maintain the bandwidth constant at a predetermined bandwidth. Also, the power consumption of the transconductance amplifier circuit 300 is thereby reduced for the predetermined bandwidth. The amount of bias current to be diverted is determined based on a maximum slew current of the transconductance amplifier circuit 300 and/or a predetermined location of a cascode pole of the transconductance amplifier circuit 300. The diverted bias current pass through the transistors (304, 306) of the current control circuit 302.

With the passage of diverted bias current through the transistors (304, 306) of the current control circuit 302, a transconductance associated with the transistors (304, 306) of the current control circuit 302 adds on to and leads to an increase in a transconductance $g_m$ of the transconductance amplifier circuit 300. With the increase in the transconductance $g_m$ of the transconductance amplifier circuit 300, the bandwidth of the transconductance amplifier circuit 300 also increases. In order to maintain a predetermined bandwidth, the transconductance of the transconductance amplifier circuit 300 is reduced by reducing the passage of current through the input differential circuitry 210 and the current control circuit 302 while keeping the current through the cascode circuitry 240 same for maintaining the slew rate. Also, the further reduction in the passage of current through the input differential circuitry 210 leads to a further reduction in the power consumption as compared to the telescopic amplifier circuit 200 described in the detailed description of FIG. 2. In an embodiment, the diverted bias current is drawn from a lower power supply that further reduces the power consumed by the transconductance amplifier circuit 300.

An increase in the transconductance $g_m$ of the transconductance amplifier circuit 300 leads to a degradation of a feedback factor (1/F) of the transconductance amplifier circuit 300. In an embodiment, the current control circuit 302 is configured such that a percentage increase in transconductance $g_m$ is higher than a percentage decrease in the feedback factor, such that optimal performance of the transconductance amplifier circuit 300 is maintained. Also by reducing the passage of current through the cascode circuitry 240, the cascode pole of the transconductance amplifier circuit 300 may be positioned such that a phase margin of the transconductance amplifier circuit 300 is reduced close to, for example, 74 degrees, which is down from, for example, a 90 degree phase margin of the telescopic amplifier circuit 100. The reduction in the phase margin results in a faster settling of a step response of the transconductance amplifier circuit 300, and, additionally, the step response becomes critically damped or under damped. The amount of the bias current diverted through the current control circuit 302 is determined based on a particular location of the cascode pole so as to achieve a predetermined phase margin.

Although the present technology has been described with reference to specific exemplary embodiments, it is noted that various modifications and changes may be made to these embodiments without departing from the broad spirit and scope of the present technology. For example, the various devices, modules, analyzers, generators, etc., described herein may be enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., application specific integrated (ASIC) circuitry and/or in Digital Signal Processor (DSP) circuitry), and the drawings are to be regarded in an illustrative rather than a restrictive sense.

Also, the circuits described and illustrated in the various embodiments as discrete or separate may be combined or integrated with other systems, modules, or circuits without departing from the scope of the present technology. Other items shown or discussed as directly coupled or communicating with each other may be coupled through some interface or device, such that the items may no longer be considered directly coupled to each other but may still be indirectly coupled and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

What is claimed is:

1. An amplifier circuit comprising: an input differential circuitry comprising a first output terminal and a second output terminal, configured to provide a pair of differential current signals at the first output terminal and the second output terminal in response to a pair of input differential voltage signals;
a cascode circuitry comprising a first cascode transistor having a terminal coupled with the first output terminal and a second cascode transistor having a terminal coupled with the second output terminal, the cascode circuitry configured to mirror the pair of differential current signals received from the first output terminal and the second output terminal to an output terminal of the first cascode transistor and an output terminal of the second cascode transistor; and
a current control circuit coupled with the first output terminal and the second output terminal, configured to divert an amount of bias current so as to reduce a current through the cascode circuitry to thereby reduce a load of the amplifier circuit, wherein the reduction in the load of the amplifier circuit allows reduction in a current through the input differential circuitry for maintaining a predetermined bandwidth of the amplifier circuit, said current control circuit comprising:
a first transistor having a first terminal, a second terminal and a third terminal, the first terminal of the first transistor coupled with the first output terminal, the second terminal of the first transistor configured to receive a first signal of the pair of input differential voltage signals;
a second transistor having a first terminal, a second terminal and a third terminal, the first terminal of the second transistor coupled with the second output terminal, the second terminal of the second transistor configured to receive a second signal of the pair of input differential voltage signals; and
a current source for biasing the first transistor and the second transistor, the current source coupled between a power supply terminal and the third terminal of the first transistor and the second transistors; and wherein the amount of the bias current that is diverted is based on at least one of a maximum slew rate of the amplifier circuit and a predetermined location of a cascode pole of the amplifier circuit.

2. A transconductance amplifier circuit comprising: an input differential circuitry comprising a first input transistor and a second input transistor, configured to convert a pair of input differential voltage signals into to a pair of differential current signals at a first output terminal and a second output terminal of the first and second input transistors, respectively;
a cascode circuitry comprising a first cascode transistor coupled with the first output terminal and a second cascode transistor coupled with the second output terminal, configured to mirror the pair of differential current signals to an output terminal of the first cascode transistor and an output terminal of the second cascode transistor; and
a current control circuit comprising a first transistor, a second transistor, and a current source for biasing the first transistor and the second transistor, the first transistor configured to receive a first signal of the pair of input differential voltage signals and coupled with the first output terminal, the second transistor configured to receive a second signal of the pair of input differential voltage signals and coupled with the second output terminal, the current source coupled between a common terminal of the first transistor and the second transistor and a power supply terminal, the current control circuit configured to divert an amount of bias current so as to reduce a current through the cascode circuitry to thereby reduce a load of the transconductance amplifier circuit, wherein the reduction in the load of the transconductance amplifier circuit allows reduction in current through the input differential circuitry for maintaining a predetermined bandwidth of the transconductance amplifier circuit; and wherein the amount of the bias current that is diverted is based on at least one of a maximum slew rate of the amplifier circuit and a predetermined location of a cascode pole of the amplifier circuit.

3. The transconductance amplifier circuit of claim 2, further comprising:
a pair of current sources coupled between the power supply terminal the output terminals of the first cascode transistor and the second cascode transistor, configured to operate as load to the transconductance amplifier circuit.

4. The transconductance amplifier circuit of claim 2, further comprising:
a current source coupled between a ground terminal and a common terminal of the first input transistor and the second input transistor for sinking a constant reference current in the first and second input transistors, wherein the pair of current sources, the cascode circuitry, the input differential circuitry and the current source are configured in a telescopic topology between the power supply terminal and the ground terminal.

5. The transconductance amplifier circuit of claim 2, wherein the first input transistor, the second input transistor, the first cascode transistor, and the second cascode transistor are one of PNP type transistors and p-type metal oxide semiconductor based transistors, and the first transistor and the second transistor are one of n-type metal oxide semiconductor based transistors and NPN type transistors.

6. The transconductance amplifier circuit of claim 2, wherein the first input transistor, the second input transistor, the first cascode transistor, and the second cascode transistor are one of n-type metal oxide semiconductor based transistors and NPN type transistors, and the first transistor and the second transistor are one of p-type metal oxide semiconductor based transistors and PNP type transistors.

7. The transconductance amplifier circuit of claim 2, comprising one configuration of:
the first input transistor and the second input transistor being p-type metal oxide semiconductor based transistors, the first cascode transistor and the second cascode transistor being PNP type transistors, and the first transistor and the second transistor being one of NPN type transistors and n-type metal oxide semiconductor based transistors; and
the first input transistor and the second input transistor being PNP type transistors, the first cascode transistor and the second cascode transistor being p-type metal oxide semiconductor based transistors, and the first transistor and the second transistor being one of NPN type transistors and n-type metal oxide semiconductor based transistors.

8. The transconductance amplifier circuit of claim 2, comprising one configuration of:
the first input transistor and the second input transistor being n-type metal oxide semiconductor based transistors, the first cascode transistor and the second cascode transistor being NPN type transistors, and the first transistor and the second transistor being one of PNP type transistors and p-type metal oxide semiconductor based transistors; and
the first input transistor and the second input transistor being NPN type transistors, the first cascode transistor and the second cascode transistor being n-type metal oxide semiconductor based transistors, and the first transistor and the second transistor being one of PNP type transistors and p-type metal oxide semiconductor based transistors.

* * * * *